United States Patent [19]
Jaecklin et al.

[11] Patent Number: 5,132,768
[45] Date of Patent: Jul. 21, 1992

[54] SEMICONDUCTOR COMPONENT WITH TURN-OFF FACILITY

[75] Inventors: André Jaecklin, Ennetbaden; Ezatoll Ramezani, Möriken; Thomas Vlasak, Birr, all of Switzerland

[73] Assignee: ASEA Brown Boveri Limited, Baden, Switzerland

[21] Appl. No.: 631,252

[22] Filed: Dec. 20, 1990

Related U.S. Application Data

[63] Continuation of Ser. No. 392,158, Aug. 10, 1989, Pat. No. 5,031,016.

[30] Foreign Application Priority Data

Aug. 19, 1988 [CH] Switzerland ............ 3105/88

[51] Int. Cl.⁵ ............ H01L 29/74; H01L 29/06; H01L 23/48; H01L 23/42
[52] U.S. Cl. ............ 357/38; 357/55; 357/56; 357/71; 357/79
[58] Field of Search ............ 357/38, 39, 55, 56, 357/71, 79

[56] References Cited

U.S. PATENT DOCUMENTS 5,017,991  5/1991  Nishizawa et al. ............ 357/38

FOREIGN PATENT DOCUMENTS 0098175  1/1984  European Pat. Off. .
0254910  2/1986  European Pat. Off. .
0194946  9/1986  European Pat. Off. .
2747945  5/1978  Fed. Rep. of Germany ........ 357/38
55-113373  9/1980  Japan ............ 357/38
57-64969  4/1982  Japan ............ 357/38

OTHER PUBLICATIONS

English translation of reference L, supra.

*Primary Examiner*—J. Carroll
*Attorney, Agent, or Firm*—Oblon, Spivak, McClelland, Maier & Neustadt

[57] ABSTRACT

In a semiconductor component with turn-off facility of the GTO type with direct pressure contact, a balancing of the local pressure distribution in the region of the cathode fingers (7) which results in an improved alternating load resistance and also in an extension of the allowable pressure range is achieved by structural matching of the anode metallization (4) to the gate-cathode structure on the cathode side.

6 Claims, 3 Drawing Sheets

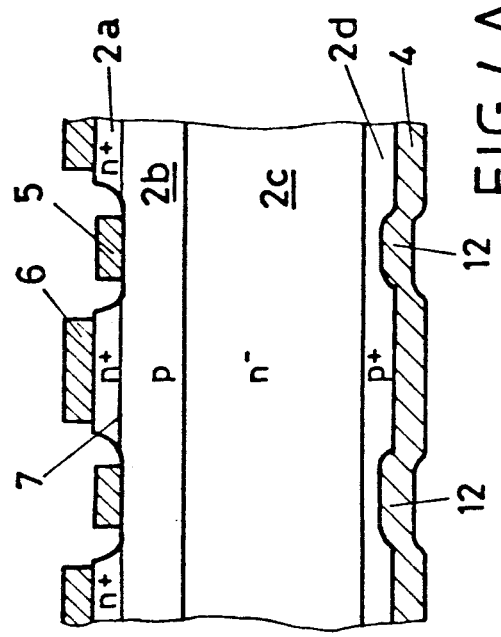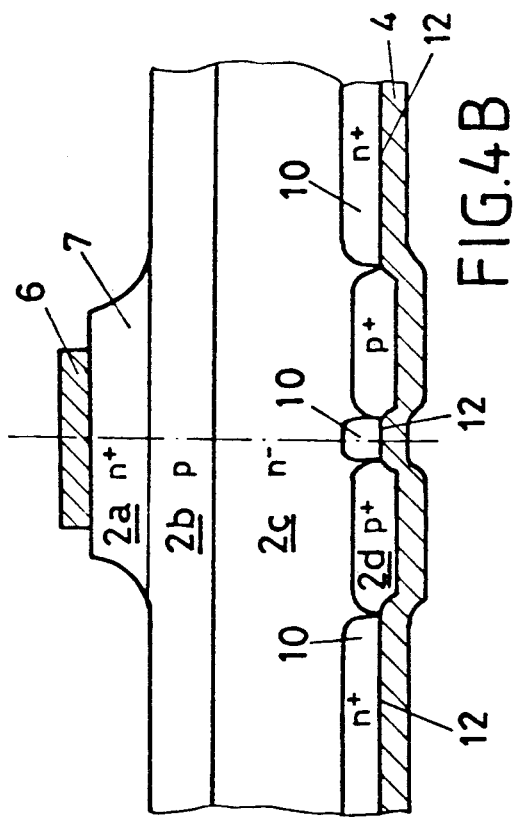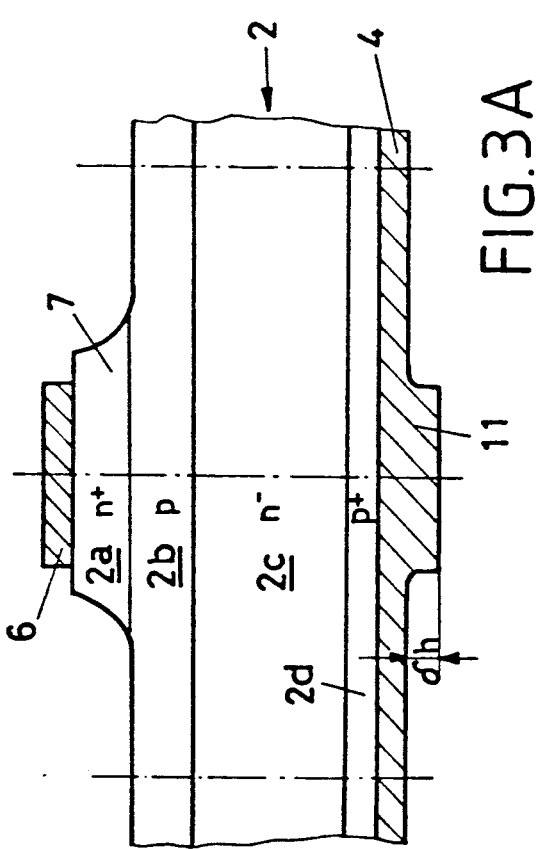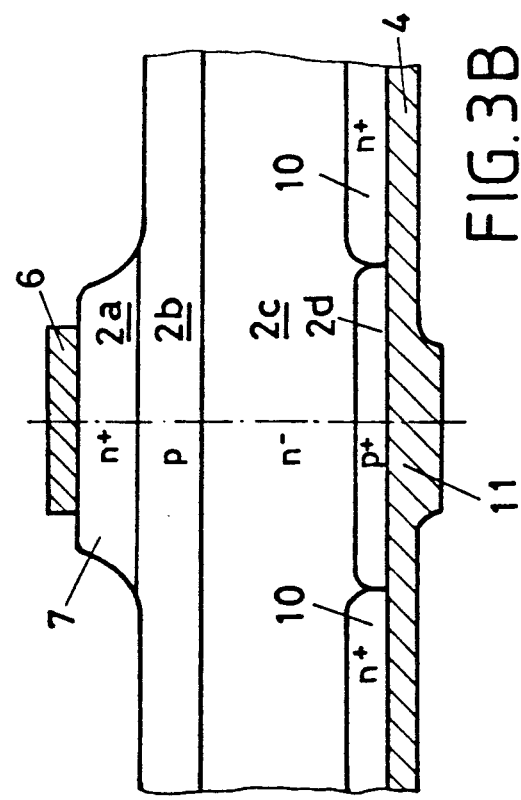

SEMICONDUCTOR COMPONENT WITH TURN-OFF FACILITY

This is a continuation of application Ser. No. 07/392,158, filed on Aug. 10, 1989, U.S. Pat. No. 5,031,016.

BACKGROUND OF THE INVENTION

1. Field of the Invention

The present invention relates to the field of power electronics. It relates in particular to a semiconductor component with turn-off facility comprising (a) a semiconductor wafer containing a sequence of differently doped layers which are arranged between a cathode side and an anode side and form a gate-turn-off thyristor (GTO) by means of a gate;

(b) on the cathode side of the semiconductor wafer, a finely subdivided gate-cathode structure having a multiplicity of island-like cathode fingers which are surrounded by a gate region;

(c) a cathode metallization over the cathode fingers;

(d) an anode metallization on the anode side of the semiconductor wafer; and (e) an anode contact and a cathode contact which are pressed onto the anode metallization or, in a multiplicity of locally limited regions, onto the cathode metallization, respectively, for the purpose of making contact.

Such a semiconductor component is disclosed, for example, by the publication EP-A1 0, 254, 910.

2. Discussion of Background

In power electronics, semiconductor components which, unlike conventional thyristors, can be switched off directly via a gate, are acquiring increasing importance. Such GTO (gate turn-off) thyristors contain a multiplicity of small-area, parallel-connected individual thyristors, also called segments, on a large-area semiconductor wafer.

Each of these individual thyristors comprises, on the cathode side, a cathode finger which is surrounded by a continuous gate region and either itself projects out of the plane of the gate region, or is of planar construction and is provided with a cathode metallization which is elevated in certain regions. On the cathode side this therefore results in a stepped, finely subdivided structure, whereas the semiconductor wafer is not usually subdivided and is of planar construction on the anode side.

The fine, and consequently mechanically sensitive structures on the cathode side of a GTO result in problems when making contact or during installation of such components. These problems are attributable in particular to the different local pressure distribution on the anode side and cathode side of the pressed semiconductor wafer.

The publication mentioned in the preamble proposes, as a solution to these problems, a so-called "direct" pressure contact on which the semiconductor wafer with the GTO active section is provided with a metallization and is pressed with adequately high pressure in the installed state between large-area metal discs having low coefficients of thermal expansion (for example, Mo or W). In this case, the pressure reaches an order of magnitude of 10 MPa, based on the total component area.

Since, as already mentioned previously, a multiplicity of small-area segments is present on the cathode side of the GTO, but a continuous large area on the anode side, a typical ratio of anode area AA to cathode area AK of $$AA/AK = 2 \ldots 10$$

Results

For geometrical reasons (for example because of an annular gate contact, a so-called ring gate), this area ratio is particularly large in the case of the practically important high-current GTO. Depending on the thickness of the semiconductor wafer, the local pressure distribution on the anode side is difficult to define (in this connection, see curve A1 in FIG. 2), whereas the local pressure distribution on the cathode side (curve K in FIG. 2) is clearly set and narrowly limited by the individual segments.

Owing to these ratios, a far higher pressure on the cathode side, which in most cases exceeds the yield point of the cathode metallization there over the entire surface or at least locally, is associated with a relatively low mean pressure on the anode side. This results in undesirable deformations of the metal layer on the cathode side which may result in a premature failure of the component (limited alternating load resistance). If, on the other hand, the pressure is reduced to avoid these deformations, a perfect contact on the anode side is no longer guaranteed, with the result that an undesirable voltage drop may occur there.

SUMMARY OF THE INVENTION

Accordingly, one object of this invention is to provide a novel semiconductor component with turn-off facility having a direct pressure contact in which the serviceability and operating reliability are substantially increased by an improved pressure distribution and the allowable range of the pressure which can be applied from the outside is increased.

This object is achieved by a component of the type mentioned in the preamble, wherein (f) the anode metallization has a finely subdivided structure such that the anode contact is also pressed onto the anode metallization in a multiplicity of locally limited regions; and (g) the regions pressed by the anode contact are situated opposite the regions pressed by the cathode contact.

The essence of the invention is to match the structure of the metallization layer on the anode side to that of the cathode side so that, in contrast to the conventional component, approximately symmetrical local pressure distributions result.

Whereas, in the general case of the invention, the cathode side of the semiconductor wafer may be of planar (see, for example, German Offenlegungsschrift 3, 616, 233) or of step construction, according to a first preferred embodiment of the invention, the component is one wherein (a) the gate-cathode structure is of stepped construction with elevated cathode fingers and a lower-lying gate region; and (b) the regions pressed by the cathode contact are in each case arranged on the cathode fingers.

A further preferred embodiment of the invention is one wherein (a) the semiconductor wafer has a flat surface on the anode side; and (b) the finely subdivided structure of the anode metallization is achieved by different thicknesses in the anode metallization.

In this embodiment, the structuring on the anode side is restricted to the anode metallization alone, without the semiconductor wafer itself having to be altered.

A third preferred embodiment of the invention is one wherein (a) the semiconductor wafer has a surface with stepped structure on the anode side;

(b) the stepped structure on the anode side essentially corresponds to the stepped gate-cathode structure;

(c) the anode metallization covers the semiconductor wafer over the entire surface.

This embodiment is associated with production-engineering advantages if the unneeded section is in any case removed by an etching process in order to structure a p-type layer originally present over the entire surface for the anode emitter.

Further exemplary embodiments of the invention emerge from the sub claims.

BRIEF DESCRIPTION OF THE DRAWINGS

A more complete appreciation of the invention and many of the attendant advantages thereof will be regularly obtained as the same becomes better understood by reference to the following detailed description when considered in conjunction with the accompanying drawings wherein a component having stepped gate-cathode structure is assumed without restricting the generality. In the drawings

FIG. 3A,B the segment structure for a component according to a first preferred embodiment of the invention without (FIG. 3A) and with (FIG. 3B) anode short circuits;

FIGS. 4A,B the segment structure for a component according to a second preferred embodiment of the invention without (FIG. 4A) and with (FIG. 4B) anode short circuits;

DESCRIPTION OF THE PREFERRED EMBODIMENT

Figure 1:
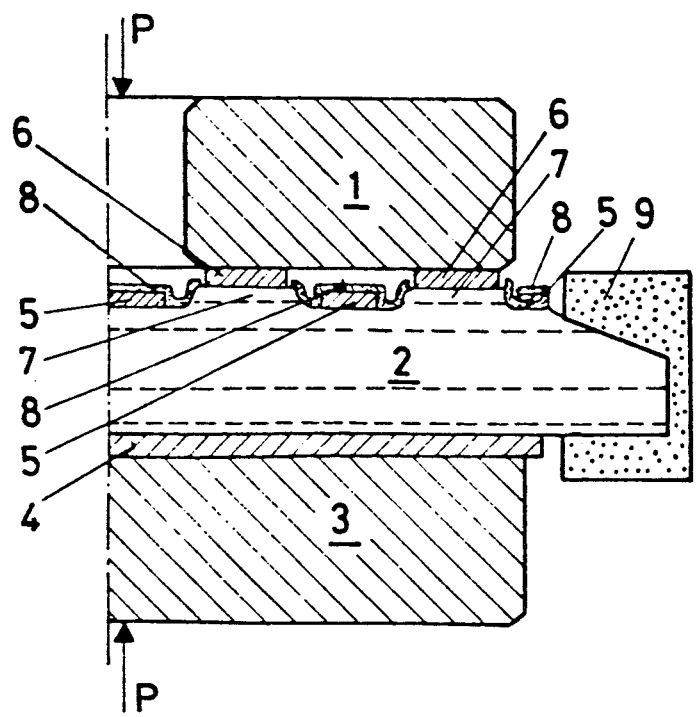
FIG. 1 shows diagrammatically the structure of a GTO thyristor having direct pressure contact according to the prior art.

Referring now to the drawings, wherein like reference numerals designate identical or corresponding parts throughout the several views, FIG. 1 shows, diagrammatically in structure, the turn-off semiconductor component having direct pressure contact and stepped gate-cathode structure according to the prior art. The central structural member of this arrangement is a large-area semiconductor wafer 2 which contains the GTO active section.

The semiconductor wafer 2 is provided with an anode metallization 4 over a large area on its lower side (anode side). On the upper side (cathode side) it has a stepped gate-cathode structure in which a multiplicity of elevated cathode fingers 7 are surrounded by a lower-lying gate region. Arranged in the gate region itself is a corresponding gate metallization 5 to which contact is made with a gate contact not shown in the Figure.

On their upper side, the cathode fingers 7 each carry a cathode metallization 6 which is of the same nature (thickness, material) as the anode metallization 4. Finally, for the purpose of insulation, an insulation layer 8 is furthermore provided in the gate regions and an edge passivation 9 at the edge of the semiconductor wafer 2.

The semiconductor wafer 2 is pressed between a metallic anode contact 3 and cathode contact 1 with a pressure P. Under the circumstances, the pressure distributes itself over a multiplicity of small pressure areas, namely the individual cathode metallizations 6 on the cathode fingers 7 and is substantially constant over each of these small pressure areas. The pressure distribution on the cathode side for a thyristor segment consequently has the form shown in FIG. 2 as curve K.

Figure 2:
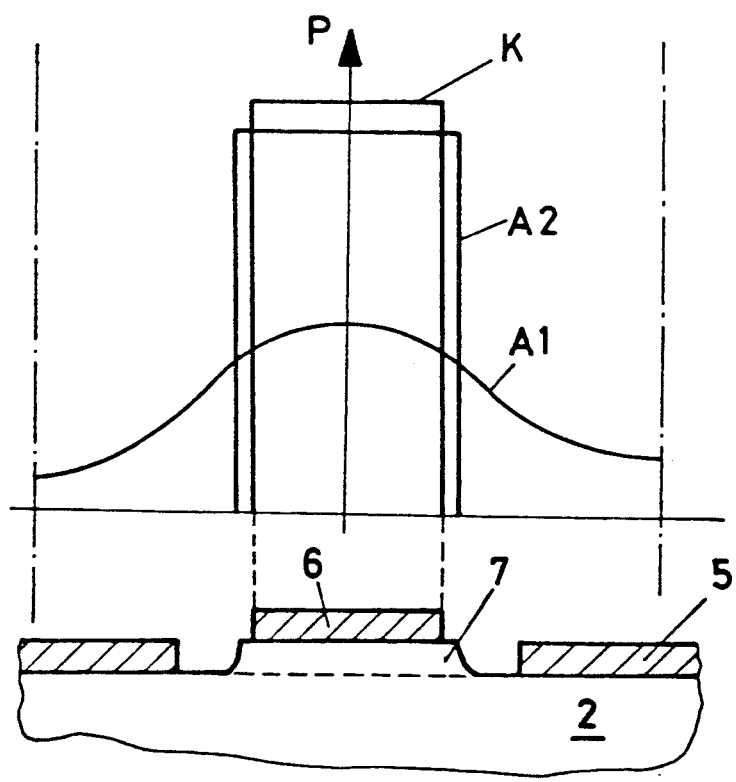
FIG. 2 the local pressure distribution for a thyristor segment on the cathode side and anode side in the known component compared with the component according to the invention.

This approximately rectangular pressure distribution on the cathode side is opposed, in the prior art, by a local pressure distribution on the anode side which is less narrowly limited and has a markedly lower maximum value instead (curve A1 in FIG. 2). At the same time, this means that a dangerously high local pressure on the small areas of the cathode fingers 7 corresponds to a relatively low mean pressure on the anode side such as is necessary to provide a reliable contact (thermal and electrical).

In order to eliminate this asymmetry, the invention proposes a substantially symmetrical local pressure distribution in which approximately the same rectangular curve (curve A2 in FIG. 2) is present on the anode side as on the cathode side. This symmetrical pressure distribution is achieved by structuring the anode metallization 4 in approximately the same way as the stepped gate-cathode structure of the anode side.

In a first preferred embodiment (FIG. 3A, B), the structure in the anode metallization 4 is achieved directly by different thicknesses in the metallization. The semiconductor wafer 2 with its variously doped layers (n-type emitter layer 2a, p-type base layer 2b, n-type base layer 2c and p-type emitter layer 2d) in this case has a flat surface on the anode side and is covered there over the entire surface with the anode metallization 4.

While the anode metallization 4 has a reduced thickness outside the regions determined by the cathode fingers 7, it thickens inside each segment to form a plateau 11 which corresponds in shape and extent essentially to the opposite situated cathode metallization 6 and is symmetrically arranged with respect to the latter.

The anode metallization 4 with local plateau 11 can be used equally for components without and with anode short circuits 10 (FIG. 3A or FIG. 3B respectively). It can be achieved by photolithographic structuring of the metal layer deposit in a conventional manner. In principle, this metal layer can be used for any metal suitable for a direct pressure contact. Preferred is Al which is deposited in a vapour deposition or sputtering process.

The thickness of the anode metallization is between 1 $\mu$m and 30 $\mu$m, preferably between 5 $\mu$m and 15 $\mu$m. So that the desired pressure distribution according to curves K and A2 in FIG. 2 is produced, a minimum difference in height $\delta h$ of at least 1 $\mu$m is necessary (FIG. 3A) because this value corresponds approximately to the elastic deformation to be expected under pressure. This difference in height may be produced, for example, by partially etching the metallization layer.

In a second preferred embodiment (FIG. 4A, B), the starting point is not a flat surface on the anode side of the semiconductor wafer 2 but a stepped surface having a structure which corresponds essentially to the gate-cathode structure on the cathode side (FIG. 4). For this purpose, recesses 12 which correspond in shape and extent approximately to the gate regions of the cathode side are etched into the semiconductor wafer 2.

In this case, the anode metallization 4 is constructed as a uniformly thick metallization over the entire surface, as a result of which projections which are comparable to the plateaus 11 from FIG. 3A, B are produced outside the recesses 12.

In the example of FIG. 4A, no anode short circuits are provided. If, on the other hand, anode short circuits 10 are present (FIG. 4B), the recesses 12 are arranged wherever the short circuits are situated. For the case shown in FIG. 4B where a central anode short circuit 10 is incorporated directly underneath the cathode finger 7, the pressure-loaded area on the anode side is divided up and depends in size and extent on the p-type emitter layer 2d situated underneath.

Figure 5A:
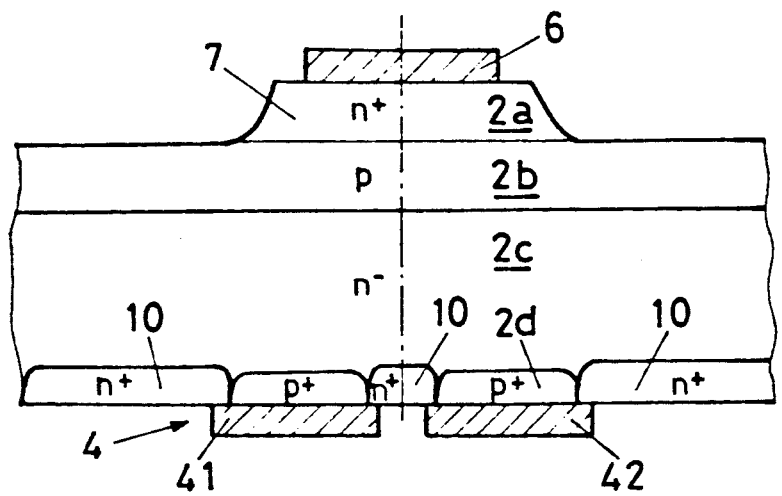
FIG. 5A an embodiment of the component according to the invention having locally limited metallization regions.

This becomes still clearer from another embodiment according to FIG. 5A in which, although the surface on the anode side of the semiconductor wafer 2 is flat, individual, locally limited metallization regions 41, 42 are now provided instead of a metallization over the entire surface with appropriately sited plateaus.

Figure 5B:
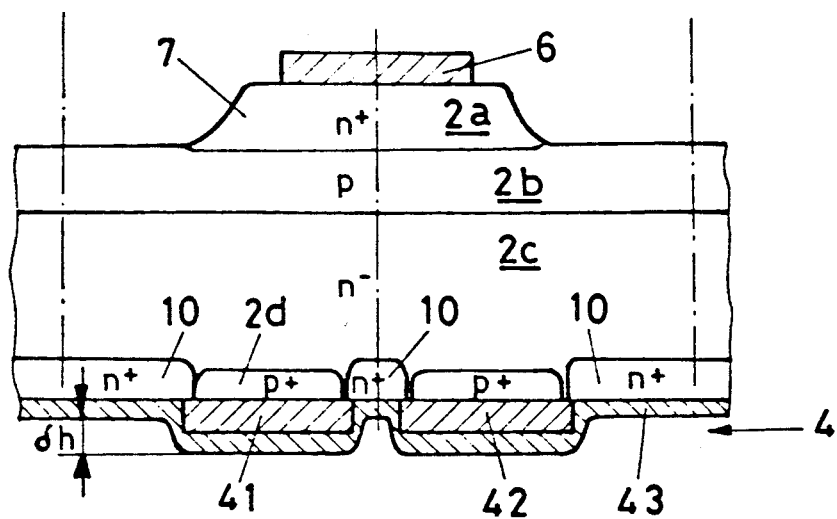
FIG. 5B an embodiment according to FIG. 5A having additional metallization layer over the entire surface.
Figure 6:
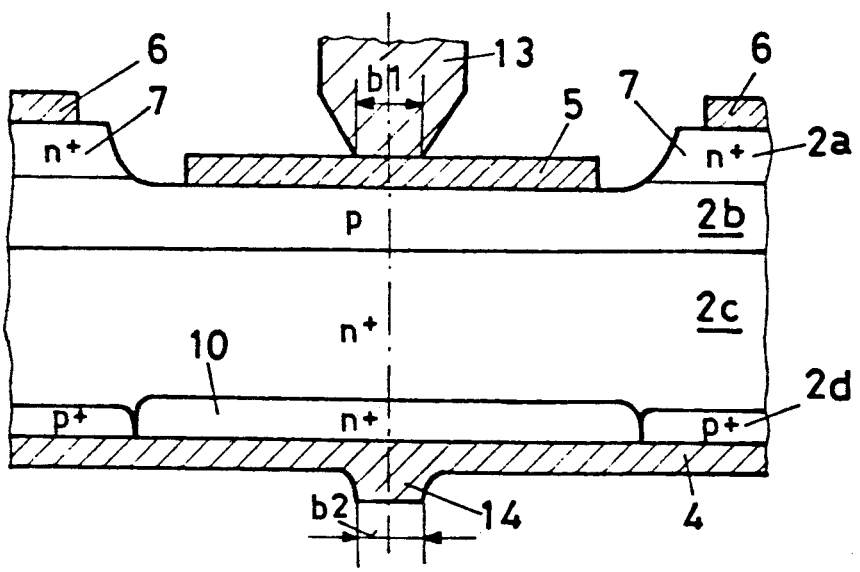
FIG. 6 the structuring of the anode metallization in the region of the gate contact according to a further embodiment of the invention.

Anode short circuits 10 are present, the metallization regions 41, 42 cover essentially the p-type emitter layer 2d and additionally overlap also the regions of the anode short circuit 10 in order to ensure they function perfectly. The same function may also be adopted by an additional metallization 43 over the entire surface according to FIG. 5B which, in addition, makes possible an improved heat dissipation on the anode side.

Balancing of the pressure distribution according to the invention is, however, not limited only to the regions of the individual segments or cathode fingers, but can be used equally well also in the gate region, regardless of whether a central gate or a ring gate is involved. In both cases, a gate contact 13 presses on the gate metallization 5 on the cathode side. A plateau 14 which corresponds in shape and extent essentially to the area pressed by the gate contact 13 can then be provided in the anode metallization 4 opposite the gate contact 13. In the case of a ring gate having a toroidal gate contact 13 and a ring width b1, the plateau 14 then also has a toroidal form and ring width b2 which is approximately equal to the ring width b1.

As already mentioned, the invention is not limited to components having stepped gate-cathode structure but can be used in the same way also for components with a planar surface on the anode side of the semiconductor wafer, as are disclosed in the above-mentioned German Offenlegungsschrift 3, 616, 233.

All in all, matching the metallization structure on the anode side according to the invention to the gate-cathode structure on the cathode side makes it possible to achieve components which are particularly functionally reliable and have long service lives.

Obviously, numerous modifications and variations of the present invention are possible in the light of the above teaching. It is therefore to be understood that above teaching. It is therefore to be understood that within the scope of the appended claims, the invention may be practised otherwise than as specifically described herein.

What is claimed as new and desired to be secured by Letters Patent of the United States is:

1. A gate turn-off thyristor with a direct pressure contact, comprising:
    a semiconductor wafer with a cathode side and an anode side;
    within said semiconductor wafer and arranged between said cathode side and said anode side a sequence of alternatingly doped layers which form said gate turn-off thyristor, comprising an n-type emitter layer, a p-type base layer, an n-type base layer, and a p-type emitter layer of a non-uniform thickness;
    on said cathode side of said semiconductor wafer, a finely subdivided stepped gate-cathode structure having a plurality of elevated island-like cathode fingers surrounded by a lower-lying gate region;
    on said anode side of said semiconductor wafer an anode surface with a stepped structure and with an anode area, said stepped structure of said anode surface effected by means of the non-uniform thickness of said p-type emitter layer and essentially corresponding to said stepped gate-cathode structure;
    a cathode metallizatiion covering said cathode fingers; an anode metallization on said anode side of said semiconductor wafer covering said anode area;
    a cathode contact plate which is directly pressed onto said cathode metallization of said cathode fingers;
    an anode contact plate which is directly pressed onto said anode metallization; and
    said anode metallization having a stepped structure which corresponds to said stepped structure of said anode surface such that said anode contact plate is pressed onto said anode metallization only in a plurality of locally limited regions being situated opposite said cathode fingers.

2. The gate turn-off thyristor as claimed in claim 1, comprising:
    within said p-type emitter layer a plurality of island-like n-type anode shorts which are distributed over said anode area; and
    said locally limited regions essentially covering only said p-type emitter layer outside said anode shorts.

3. The gate turn-off thyristor as claimed in claim 2, comprising:
    said semiconductor wafer provided with a gate metallization on said cathode side inside said gate region;
    a gate contact provided which presses on said gate metallization over a pressing area; and
    said anode metallization having a plateau which is situated opposite said gate contact, and which corresponds in its extent essentially to said pressing area of said gate contact.

4. The gate turn-off thyristor as claimed in claim 2, comprising:
    said anode metallization composed of Al and having a thickness of between 1 $\mu$m and 30 $\mu$m.

5. The gate turn-off thyristor as claimed in claim 4, wherein said thickness of said anode metallization is between 5 $\mu$m and 15 $\mu$m.

6. The gate turn-off thyristor as claimed in claim 2, wherein the part of said anode metallization located inside said locally limited regions and the part of said anode metallization located outside said locally limited regions have a difference in height of at least 1 $\mu$m.

* * * * *